United States Patent
Lyu et al.

(10) Patent No.: US 7,898,584 B2
(45) Date of Patent: Mar. 1, 2011

(54) IMAGE SENSORS FOR REDUCING FLICKER AND METHODS OF MANUFACTURING THE SAME

(75) Inventors: Jeong Ho Lyu, Suwon-si (KR); Duck Hyung Lee, Kyungki-Do (KR); Kab sung Uem, Kyungki-Do (KR); Hee Geun Jeong, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1092 days.

(21) Appl. No.: 11/339,735

(22) Filed: Jan. 26, 2006

(65) Prior Publication Data

US 2006/0250511 A1    Nov. 9, 2006

(30) Foreign Application Priority Data

May 6, 2005    (KR) .................. 10-2005-0037929

(51) Int. Cl.
- *H04N 3/14* (2006.01)
- *H01L 21/8238* (2006.01)
- *H01L 21/3205* (2006.01)
- *H01L 21/4763* (2006.01)
- *H01L 21/469* (2006.01)

(52) U.S. Cl. ......... 348/294; 438/216; 438/585; 438/592; 438/776

(58) Field of Classification Search .................. 348/294; 438/585, 592, 776
See application file for complete search history.

(56) References Cited

U.S. PATENT DOCUMENTS

| | | | |
|---|---|---|---|
| 3,983,573 A * | 9/1976 | Ishihara | 257/234 |
| 6,297,168 B1 * | 10/2001 | Shieh et al. | 438/723 |
| 6,531,360 B2 | 3/2003 | Lee | |
| 6,610,615 B1 * | 8/2003 | McFadden et al. | 438/776 |
| 6,727,134 B1 * | 4/2004 | Chen et al. | 438/216 |
| 6,972,995 B1 * | 12/2005 | Hopper et al. | 365/185.19 |
| 7,001,810 B2 * | 2/2006 | Dong et al. | 438/261 |
| 7,030,918 B1 * | 4/2006 | Nakashiba | 348/294 |
| 7,164,447 B2 * | 1/2007 | Takahashi | 348/350 |
| 2003/0216059 A1 * | 11/2003 | McFadden et al. | 438/795 |
| 2004/0183931 A1 * | 9/2004 | Yamazaki et al. | 348/294 |
| 2004/0262646 A1 | 12/2004 | Patrick et al. | |
| 2006/0172554 A1 * | 8/2006 | Wang et al. | 438/787 |

FOREIGN PATENT DOCUMENTS

| | | |
|---|---|---|
| JP | 05-129647 | 5/1993 |
| KR | 1996-0009203 | 3/1996 |
| KR | 1020020029205 A | 4/2002 |
| KR | 1020020034316 A | 5/2002 |
| KR | 1020020048708 A | 6/2002 |
| KR | 1020030092997 A | 12/2003 |
| KR | 1020040007968 A | 1/2004 |

OTHER PUBLICATIONS

Hisayo Sasaki Momose et al., "A study of flicker noise in n- and p-MOSFETs with ultra-thin gate oxide in the direct-tunneling regime," 1998 IEEE, pp. 34.3.1-34.3.4.

Jeong-Ho Lyu et al., "Reduction of Random Noise in CMOS Image Sensors Extendible to 2.0umx2.0um Pixel."

* cited by examiner

*Primary Examiner* — Tuan Ho
*Assistant Examiner* — Quang V Le
(74) *Attorney, Agent, or Firm* — Volentine & Whitt, PLLC

(57) ABSTRACT

In one aspect, an image sensor is provided which includes an active pixel array and a control circuit connected to the active pixel array. The active pixel array of this aspect includes a plurality of first gate dielectric layers, and the control circuit includes a plurality of second gate dielectric layers, where the first gate dielectric layers are plasma nitrided silicon oxide layers.

26 Claims, 14 Drawing Sheets

IMAGE SENSORS FOR REDUCING FLICKER AND METHODS OF MANUFACTURING THE SAME

BACKGROUND OF THE INVENTION

1. Field of the Invention

The present invention generally relates to image sensors. More particularly, the present invention relates to image sensors configured to reduce flicker noise and to methods of manufacturing images sensors to reduce flicker noise.

2. Description of the Related Art

Certain types of image sensors utilize photo detectors to capture incident light and convert the light to an electric charge capable of image processing. Examples include Complimentary Metal Oxide Semiconductor (CMOS) image sensors (CIS). CIS devices are generally characterized by analog sensing circuits coupled to CMOS control circuits. The analog sensing circuits include an array of photo detectors having access devices (e.g., transistors) for connection to word lines and bit lines. The CMOS control circuits may include a timing generator and a variety of image processing circuits, such as row decoders, column decoders, column amplifiers, output amplifiers, and so on. Generally speaking, the configuration of the CIS device is analogous to that of a CMOS memory device.

In the meantime, the gate dielectric layers of MOS transistor devices contained in the control circuits of CIS devices have become thinner with decreased design rules and higher operational speeds. As such, the thin gate dielectric layers are thermally nitrided to embed nitrogen atoms which prevent or inhibit boron penetration from the gate electrodes of p-type MOSFETs into the substrate underlying the dielectric layers. Boron penetration is to be avoided since it can induce shifts and fluctuations in the threshold voltages of the devices and degrade the drive current of the CMOS circuits. The thermally nitrided gate oxide layers are generally formed by injecting oxygen and nitrogen gas into a high-temperature annealing furnace which contains one or more wafers being fabricated into CIS devices.

The present inventors have discovered, however, the nitrided gate oxide layers of the conventional CMOS image sensor are a source of increased flicker noise in CIS devices.

SUMMARY OF THE INVENTION

According to one aspect of the present invention, an image sensor is provided which includes an active pixel array and a control circuit connected to the active pixel array. The active pixel array includes a plurality of first gate dielectric layers, and the control circuit includes a plurality of second gate dielectric layers, where the first gate dielectric layers are plasma nitrided silicon oxide layers.

According to another aspect of the present invention, an image sensor is provided which includes a substrate of a first conductivity type, a photodiode region of a second conductivity type located in the substrate, and an amplifying transistor having a first gate electrode electrically connected to the photodiode region and including a first gate dielectric located between the surface of the substrate and the first gate, where the first gate dielectric is a plasma nitrided silicon oxide layer.

According to still another aspect of the present invention, an image sensor is provided which includes a substrate of a first conductivity type, a photodiode region of a second conductivity type located in the substrate, and an amplifying transistor having a first gate electrode electrically connected to the photodiode region and including a first gate dielectric located between the surface of the substrate and the first gate, where the first gate dielectric is a nitrided silicon oxide layer having a peak nitrogen concentration in an upper half of the layer relative to a bottom surface of the layer adjacent the substrate.

According to yet another aspect of the present invention, an image sensor is provided which includes an active pixel array and a control circuit connected to the active pixel array. The active pixel array includes a plurality of first gate dielectric layers, and the control circuit includes a plurality of second gate dielectric layers, where the first gate dielectric layers are silicon dioxide layers and the second gate dielectric layers are at least one of thermally nitrided oxide layers and plasma nitrided oxide layers.

According to another aspect of the present invention, a method of forming an image sensor is provided which includes forming a first dielectric layer over a first region of a substrate, and a second dielectric layer over a second region of the substrate, where the first dielectric layer is formed by plasma treatment in a nitrogen atmosphere. The method further includes forming an active pixel array in the first region of the substrate such that the first dielectric layer forms a plurality of plasma nitrided silicon oxide gate layers of the active pixel array, and forming a control circuit in the second region of the substrate which is operatively connected to the active pixel array.

According to another aspect of the present invention, a method of forming an image sensor is provided which includes forming a first dielectric layer over a first region of a substrate, and a second dielectric layer over a second region of the substrate, where the first dielectric layer is formed as a silicon dioxide layer, and the second dielectric layer is formed by thermal or plasma treatment in a nitrogen atmosphere. The method further includes forming an active pixel array in the first region of the substrate such that the first dielectric layer forms a plurality of silicon dioxide gate layers of the active pixel array, and forming a control circuit in the second region of the substrate such that the second dielectric layer forms a plurality of nitrided silicon oxide gate layers of the control circuit, where the control circuit is operatively connected to the active pixel array.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

Figure 1:
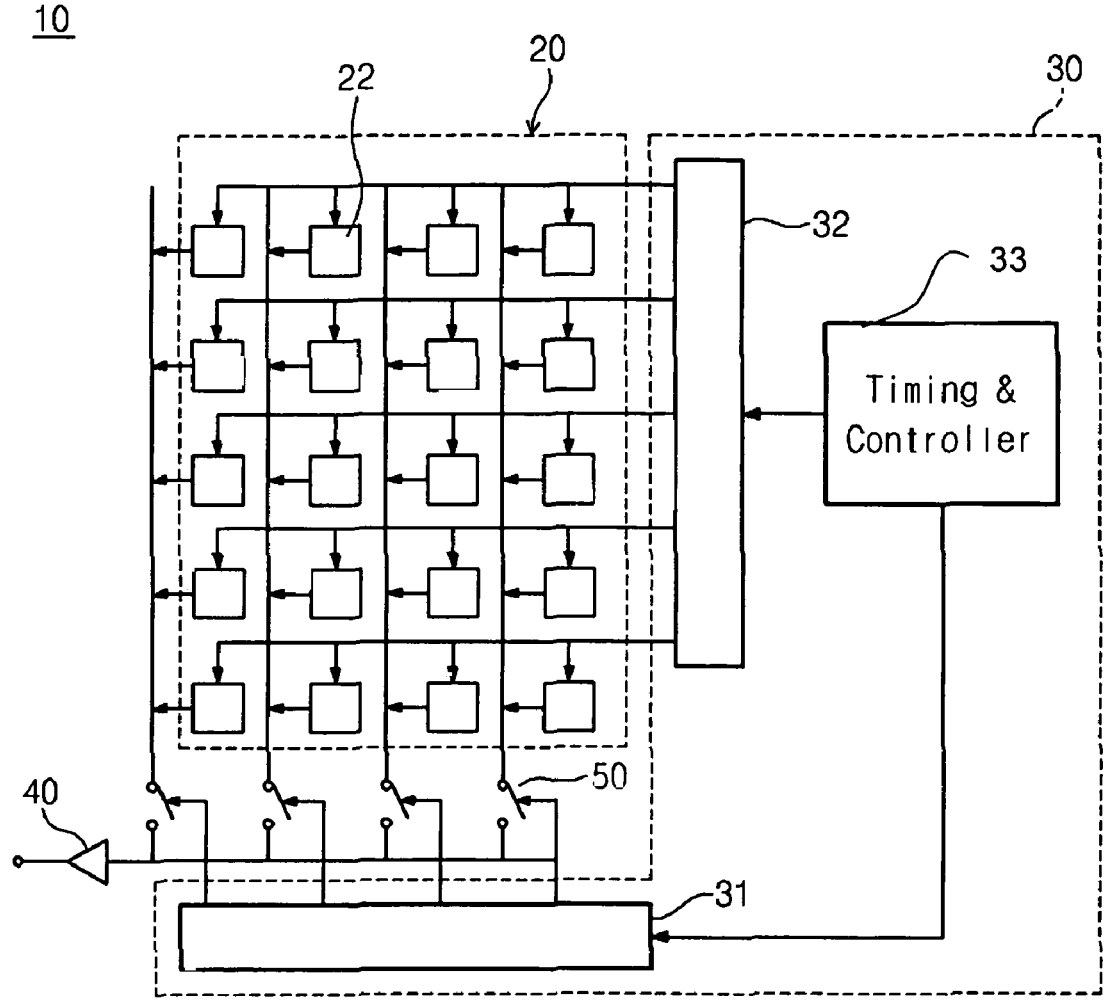
FIG. 1 is a schematic block diagram of a CIS device of an embodiment of the present invention.

As discussed previously, image sensor devices are generally configured by analog sensing circuits coupled to control circuits. The analog sensing circuits include an array of photo detectors having access devices (e.g., transistors) for connection to control circuits. The control circuits may include, for example, a timing generator and a variety of image processing circuits, such as row decoders, column decoders, column amplifiers, output amplifiers, and so on.

Embodiments of the present invention are at least partially characterized by suppression of flicker noise which would otherwise result from the use of a thermally nitrided gate oxide layer in the analog sensing circuits of the image sensor device.

In particular, according to some embodiments of the present invention, the gate dielectric layers of the analog sensing circuits of the image sensor are formed of a pure silicon oxide. Herein, pure silicon oxide is defined as a silicon oxide which is substantially free of nitrogen, such as $SiO_2$. In this case, the gate dielectric layers of the control circuits of the image sensor may be formed, for example, of thermally nitrided silicon oxide or plasma nitrided silicon oxide.

According to other embodiments of the present invention, the dielectric layers of the analog sensing circuits of the image sensor are formed of plasma nitrided silicon oxide. In this case, the gate dielectric layers of the control circuits of the image sensor may be formed, for example, of thermally nitrided silicon oxide, plasma nitrided silicon oxide, or a pure silicon layer.

A plasma nitrided oxide layer can be structurally distinguished from a thermally nitrided oxide layer by examination of the nitrogen concentration profile within the layers. Generally, the peak nitrogen concentration of a plasma nitrided oxide layer will be located in an upper portion of the layer, e.g., in an upper half of the layer. This is in contrast to a thermally nitrided oxide layer in which the peak concentration will be lower within the layer. Also, different nitrogen concentration profile characteristics are present within the lower portion of the oxide layer adjacent the substrate interface. That is, in the case of a plasma nitrided oxide layer, a decreasing nitrogen concentration in the lower portion of the oxide layer will be observed as the oxide layer makes contact with the underlying substrate. In contrast, in the case of a thermally nitrided oxide layer, an increasing nitrogen concentration in the lower portion of the oxide layer will be observed as the oxide layer makes contact with the substrate.

Without being limited by theory, it is believed that the relatively high nitrogen content of the thermally nitrided gate dielectric layers induces random noise, and hence flicker, in the transistors of the analog sensor circuitry of the CIS device. The high nitrogen content is especially prevalent in the lower portion of the gate dielectric layer where the layer interfaces with the underlying substrate, and accordingly, the trap density at the interface is increased to induce random noise. As will be demonstrated later in connection with FIGS. 7-9, the random noise can be significantly reduced by employing pure silicon oxide or plasma nitrided silicon oxide as the gate dielectric layers of the analog sensor circuits.

As will be described below, the analog sensor circuit may include an amplifying transistor operating as a source follower. This transistor may have a gate directly or indirectly connected to a photo detector element of the analog sensor circuit, and a source/drain region directly or indirectly connected to an output line of the analog sensor circuit. In this case, the operating characteristics of the amplifying transistor can have a significant impact on the overall performance of the image sensor. As such, in the analog sensing circuit, it is preferred that at least the gate dielectric of the amplifying transistor be formed in accordance with embodiments described herein.

FIG. 1 illustrates an example in which an embodiment of the present invention is configured as a CMOS image sensor (CIS) 10. The CIS 10 generally includes an active pixel array 20 and CMOS control circuitry 30. As is schematically shown in FIG. 1, the pixel array 20 includes a plurality of active pixels 22 generally arranged in matrix form. Word lines are respectively connected to the pixels 22 of each row of the pixel array 20, and bit lines are respectively connected to the pixels 22 of each column of the pixel array 20. The CMOS circuitry 30 includes a row decoder 32 for selecting rows (word lines) of the pixel array 20, a column decoder 31 for selecting columns (bit lines) of the pixel array 20, and a timing and controller unit 33 which controls an operation and timing of the row decoder 32 and column decoder 31. Selected bit lines are connected to an output amplifier 40 via switching elements 50 controlled by the CMOS circuitry 30.

Figure 2:
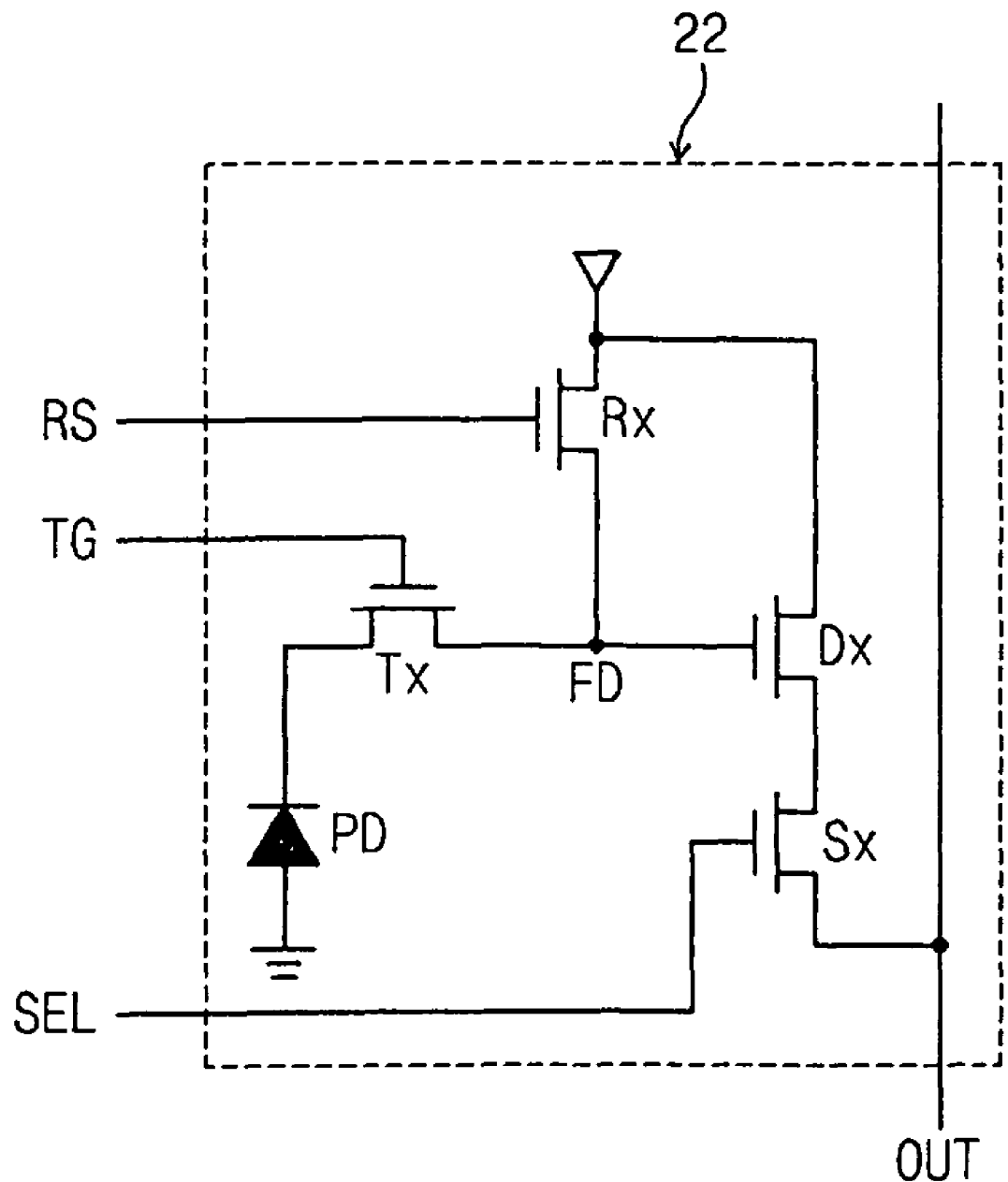
FIG. 2 is an equivalent circuit diagram of an active pixel of the CIS device of FIG. 1.

An equivalent circuit diagram of an example of an active pixel 22 is shown in FIG. 2. A photo-receiving element of the active pixel 22 captures incident light and converts the captured light into an electric charge. In this example, the photo-receiving element is a photodiode PD. The electric charge is selectively transferred from the photodiode PD to a floating diffusion region FD via a transfer transistor Tx. The transfer transistor Tx is controlled by a transfer gate TG signal. The floating diffusion region FD is connected to the gate of a driver transistor Dx which functions as is a source follower (amplifier) for buffering an output voltage. The output voltage is selectively transferred to an output line OUT by a select transistor Sx. The select transistor Sx is controlled by a select signal SEL. A reset transistor Rx is controlled by a reset signal RS and resets charges accumulated in the floating diffusion region FD to a reference level.

It is noted that one or more of the transistors shown in FIG. 2 may be optionally omitted. For example, the floating diffusion region FD may be electrically connected to the photo-receiving element PD, in which case the transfer transistor TX may be omitted. As another example, the drive transistor Dx may be electrically connected to the output line OUT, in which case the selection transistor Sx may be omitted.

Figure 3:
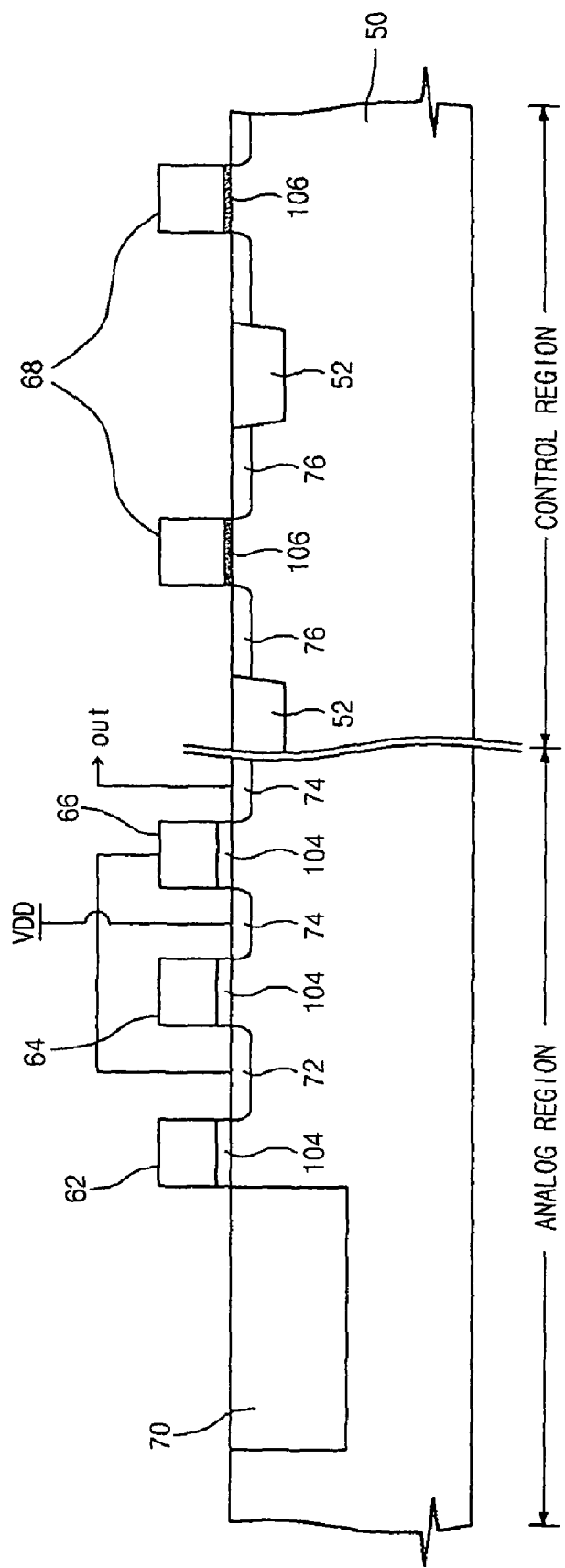
FIG. 3 is a schematic cross-sectional view of a portion of an image sensor according to an embodiment of the present invention.

FIG. 3 is a schematic cross-sectional view illustrating portions of an image sensor in accordance with one embodiment of the present invention. In the example of this embodiment, the image sensor is a CMOS image sensor (CIS) device. Also in the example of this embodiment, the gate dielectric layers of the analog sensing circuits are formed of silicon dioxide, while the gate dielectric layers of the control circuits are formed of thermally nitrided silicon oxide or plasma nitrided silicon oxide.

As shown in FIG. 3, a substrate 50 of the CMOS image sensor is generally divided into an analog region and a control region. Herein, the analog region is defined as the portion of the CMOS image sensor containing the active pixel elements such as those shown in the example of FIG. 2. The control region is defined as the portion of the CMOS image sensor containing elements for processing signals derived from the analog region. The control region may include, for example, digital, logic and/or analog circuits, such as a timing generator and an image signal processor. In the example of this embodiment, the control region is primarily made up of digital CMOS circuits.

The analog region of the CMOS image sensor of FIG. 3 includes the substrate 50, a photo-receiving element 70, a transfer gate 62, a reset gate 64, a floating diffusion region 72, source and drain regions 74, and a drive gate 66. Also, as illustrated, each of the gates 62, 64 and 66 includes a gate dielectric layer 104. In this embodiment, the gate dielectric layers 104 are formed of silicon dioxide. The source/drain region 74 located between the gates 64 and 66 is electrically connected to a source voltage VDD, while the other source/drain region 74 is electrically connected to an output line OUT. Although not shown, one or more selection transistors (e.g., Sx in FIG. 2) may be optionally interposed between the other source/drain region 74 and the output line OUT.

The photo-receiving element 70 generally functions to accumulate electrical charges produced in response to incident light energy (photons). In this example, the photo-receiving element 70 is an n-type photodiode region located in a p-type region of the substrate 50. As will be appreciate by those skilled in the art, the photo-receiving element 70 may be configured a number of different ways, and one or more layers may be interposed between the photo-receiving element 70 and the surface of the substrate 50.

Charges accumulated in the photo-receiving element 70 are selectively transferred to the floating diffusion region 72 by action of the transfer gate 62. As previously suggested, however, the transfer gate 62 (TX in FIG. 2) may be omitted, in which case the floating diffusion region 72 is electrically coupled to the photo-receiving element 70.

As shown in FIG. 3, the floating diffusion region 72 is electrically connected to the drive gate 66. This is similarly illustrated in FIG. 2 where the floating diffusion region FD is connected to the gate of the drive transistor Dx. As such, the source voltage VDD is selectively applied to the output line OUT in accordance with a voltage of the floating diffusion region 72.

The floating diffusion region 72 is reset to the source voltage VDD by action of the reset gate 64. This is similarly illustrated in FIG. 2 where the reset signal RS is applied to the gate of the reset transistor Rx, thus selectively applying the source voltage to the floating diffusion region FD.

As mentioned above, the control region of the CMOS image sensor of this example includes digital CMOS circuits. This is generally illustrated in FIG. 3 by a pair of CMOS transistors separated by a device isolation region 52. Each transistor includes a gate electrode 68, a gate dielectric layer 106, and source/drain regions 76. In this embodiment, the gate dielectric layers 106 are formed of thermally nitrided silicon oxide or plasma nitrided silicon oxide.

A method of manufacturing a CMOS image sensor of FIG. 3 will now be described with reference to the cross-sectional views of FIG. 4A through FIG. 4D.

Figure 4A:
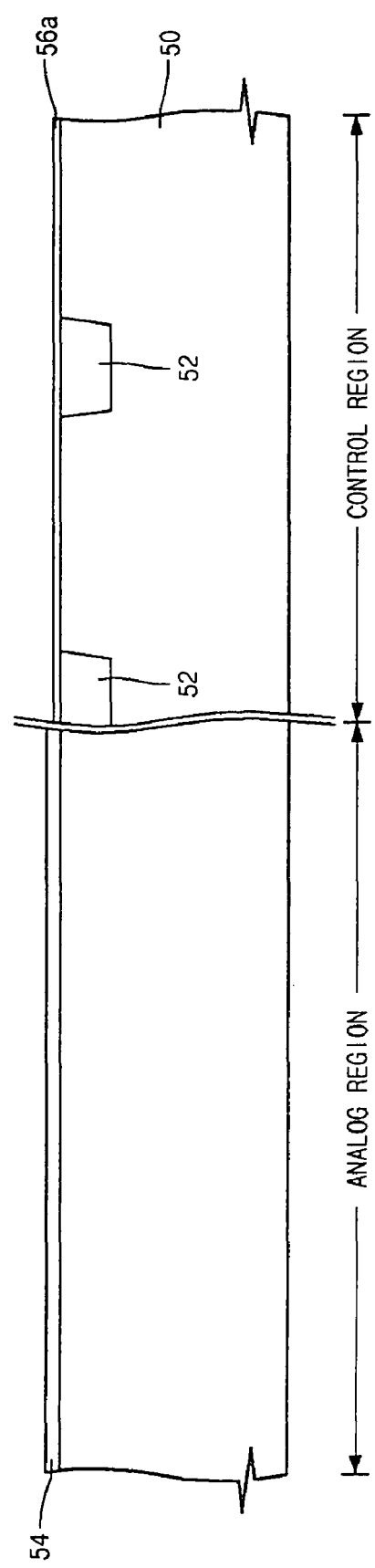
FIGS. 4A through 4D are schematic cross-sectional views for explaining a method of fabricating the image sensor of FIG. 3 according to an embodiment of the present invention.

Referring first to FIG. 4A, a plurality of device isolation regions 52 are formed in the control region of a semiconductor substrate 50. A passivation layer (not shown), such as a silicon nitride layer, is then formed to cover the control region. Then, a first oxidation process is carried out to partially grow a silicon dioxide layer 54 in the analog region. The passivation layer is then removed, and a second oxidation process is carried out to grow a remaining portion of the silicon dioxide layer 54 in the analog region and to grow a silicon dioxide layer 56a in the control region. Examples of first and second oxidation processes include conventional thermal or plasma enhanced chemical vapor deposition processes.

Although the invention is not so limited, transistors located in the analog region of the CMOS image sensor may generally operate at a higher voltage (e.g., 2.8V) than transistors located in the control region (e.g., 1.8V). As such, the thicknesses of the gate dielectric layer 54 in the analog region (e.g., 7 nm) may be greater than the thickness of the gate dielectric layer 56a of the control region (e.g., 4 nm).

As described above, the analog region is exposed to two oxidation processes, whereas the control region is exposed to a single oxidation process. As such, the gate dielectric layers of the analog region may be formed to a greater thickness than the gate dielectric layers of the control region.

Other methods may be utilized to obtain gate dielectric layers of differing thicknesses. As one example only, after an initial silicon oxide layer is formed over an entirety of the substrate 50, the surface portion of the silicon oxide layer located over the control region may be removed to reduce its thickness. Thereafter, the entire surface of the substrate 50 may be oxidized in a single process.

Figure 4B:
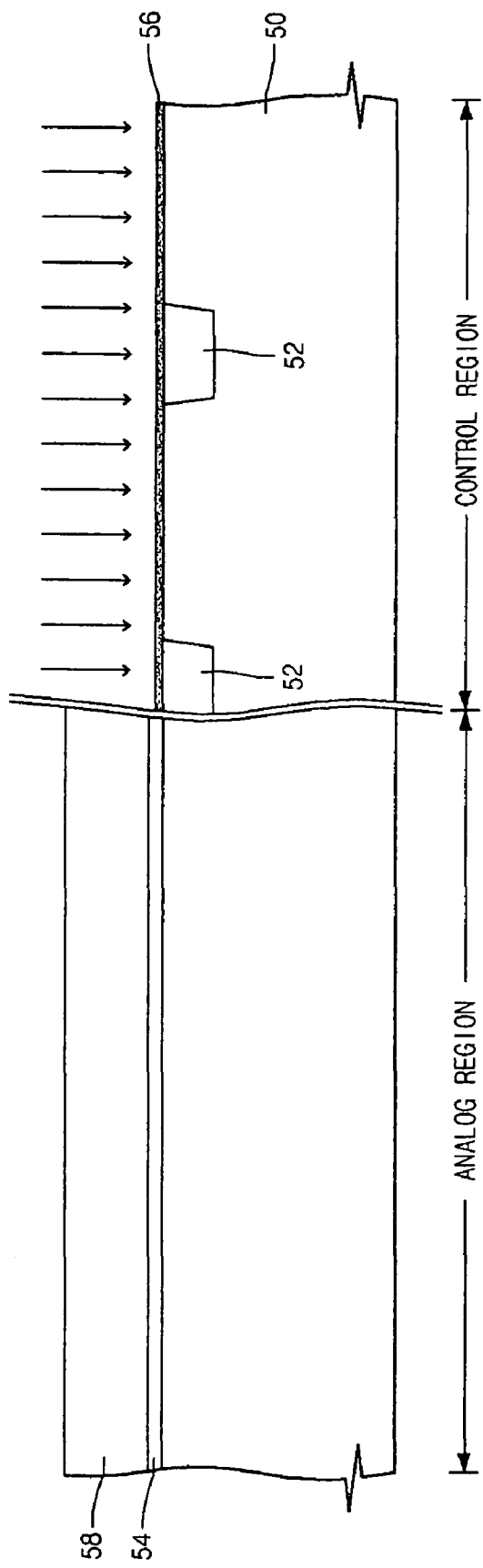

Referring now to FIG. 4B, the silicon oxide layer 54 located over the analog region is covered with a passivation layer, such as a photoresist layer 58. The exposed silicon oxide layer 56a is then subjected to plasma treatment in a nitrogen atmosphere to form a plasma nitrided oxide layer 56. The plasma treatment may, for example, be performed at room temperature, at a pressure of between 20 mTorr to 12 Torr, at a plasma power of between 20 Watts and 200 Watts, and with a nitrogen inflow rate of between 50 and 5000 scm. The nitrogen atoms of the nitrided oxide layer 56 function to inhibit boron penetration into the substrate 50 from later formed gate electrodes of p-type MOSFETs contained in the control region.

As one alternative, a thermally nitrided oxide layer can be formed instead of the plasma nitrided oxide layer 56. In this case, the thermally nitrided oxide layer can be obtained, for example, at the temperature of between 800° C. and 1000° C. in a furnace environed with oxide source gas and nitrogen gas.

It is noted that the silicon dioxide layer 54 of the analog region exhibits a lower trap density than the nitrogen treated oxide layer 56 in control region.

Figure 4C:
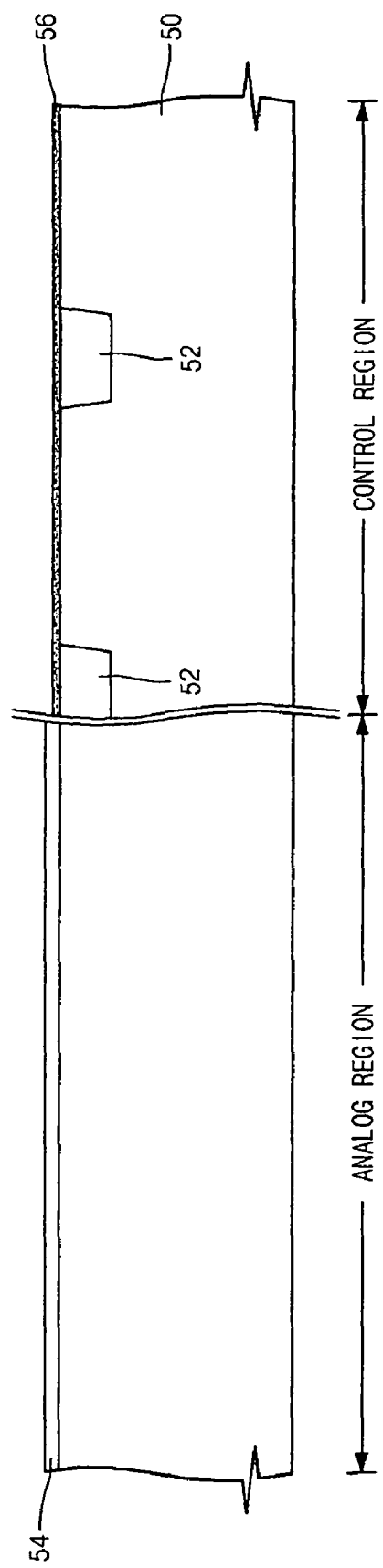

FIG. 4C illustrates the structure resulting after removal of the passivation layer 58 (FIG. 4B). As shown, the structure includes the silicon dioxide layer 54 located over the analog region of the substrate 50, and the thermally nitrided or plasma nitrided silicon oxide layer 56 located over the control region of the substrate 50.

Figure 4D:
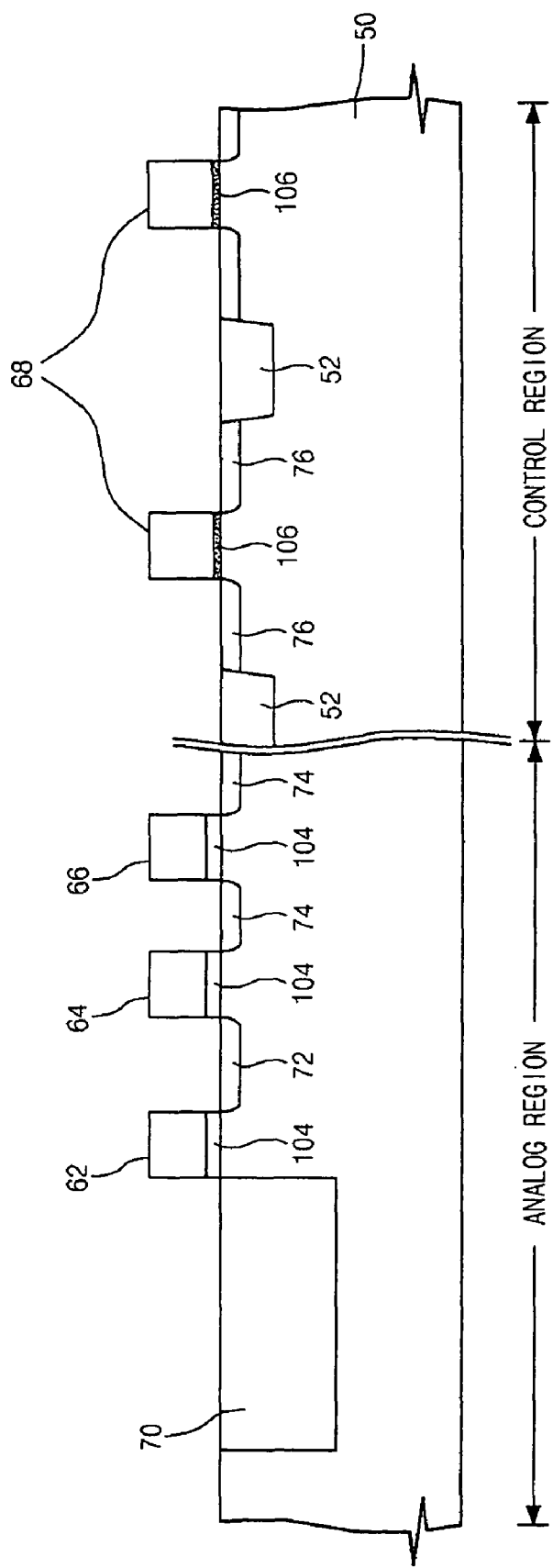

For completeness, FIG. 4D is a cross-sectional view illustrating the same structure as FIG. 3, which may be fabricated using conventional techniques from the structure of FIG. 4C. Generally, a poly-silicon layer is patterned to form the gate electrodes 62, 64, 66 and 68, the oxide layers 54 and 56 (FIG. 4C) are etched to define the gate dielectric layers 104 and 106, and implantation processes are carried out to form the photodetector region 70 and the source/drain regions 72, 74 and 76. Like reference numbers denote like elements in FIGS. 3 and 4D, and accordingly, a detailed functional description of each of the elements of FIG. 4D is omitted here.

The gate dielectric layers 104 of FIG. 4D are formed from the silicon oxide layer 54 of FIG. 4C, and the gate dielectric layers 106 of FIG. 4D are formed from the nitrided silicon oxide layer 56 of FIG. 4C. As such, the gate dielectric layers 104 of the analog region of the image sensor are formed of pure silicon oxide and thus are effective in suppressing flicker noise, while the gate dielectric layers 106 of the control region of the image sensor are formed of nitrided silicon oxide and thus are effective in inhibiting boron penetration from the gate electrodes of p-type MOSFETs.

Figure 5:
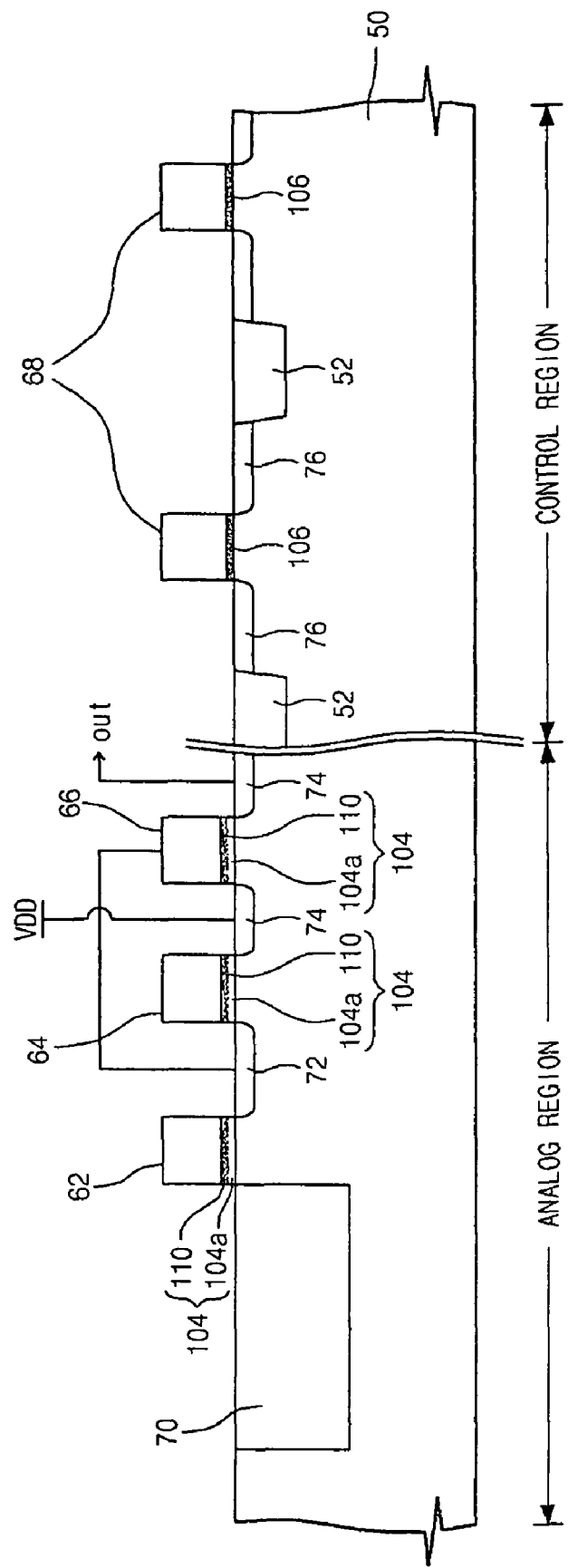
FIG. 5 is a schematic cross-sectional view of a portion of an image sensor according to another embodiment of the present invention.

FIG. 5 is a schematic cross-sectional view illustrating portions of an image sensor in accordance with another embodiment of the present invention. In the example of this embodiment, the image sensor is a CMOS image sensor (CIS) device. Also in the example of this embodiment, the gate dielectric layers of the analog sensing circuits are at least partially formed of plasma nitrided silicon oxide, while the gate dielectric layers of the control circuits are formed of thermally nitrided silicon oxide or plasma nitrided silicon oxide.

As shown in FIG. 5, a substrate 50 of the CMOS image sensor is generally divided into an analog region and a control region. As before, the analog region is defined as the portion of the CMOS image sensor containing the active pixel elements such as those shown in the example of FIG. 2. The control region is defined as the portion of the CMOS image sensor containing elements for processing signals derived from the analog region. The control region may include, for example, digital, logic and/or analog circuits, such as a timing generator and an image signal processor. In the example of this embodiment, the control region is primarily made up of digital CMOS circuits.

The analog region of the CMOS image sensor of FIG. 5 includes the substrate 50, a photo-receiving element 70, a transfer gate 62, a reset gate 64, a floating diffusion region 72, source and drain regions 74, and a drive gate 66. Also, as illustrated, each of the gates 62, 64 and 66 include a gate dielectric layer 104. In this embodiment, the gate dielectric layers 104 include a nitrided oxide portion 110 formed over a non-nitrided oxide portion 104 *a*. The source/drain region 74 located between the gates 64 and 66 is electrically connected to a source voltage VDD, while the other source/drain region 74 is electrically connected to an output line OUT. Although not shown, one or more selection transistors (e.g., Sx in FIG. 2) may be optionally interposed between the second source/drain region 74 and the output line OUT.

The control region of the CMOS image sensor of this example includes digital CMOS circuits. This is generally illustrated in FIG. 5 by a pair of CMOS transistors separated by a device isolation region 52. Each transistor includes a gate electrode 68, a gate dielectric layer 106, and source/drain regions 76. In this embodiment, the gate dielectric layers 106 are formed of thermally nitrided silicon oxide or plasma nitrided silicon oxide.

The various elements shown in FIG. 5 function in the same manner as the like-numbered elements of previously described FIG. 3. Accordingly, a detailed description of the elements of FIG. 5 is omitted here to avoid redundancy.

A method of manufacturing a CMOS image sensor of FIG. 5 will now be described with reference to the cross-sectional views of FIG. 6A through FIG. 6C.

Figure 6A:
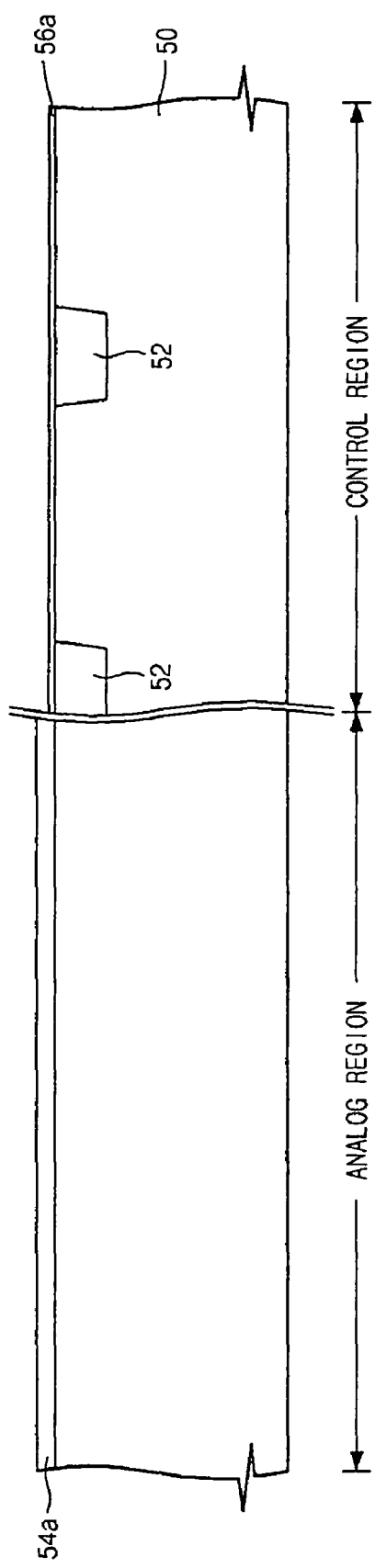
FIGS. 6A through 6C are schematic cross-sectional views for explaining a method of fabricating the image sensor of FIG. 5 according to an embodiment of the present invention.

Referring first to FIG. 6A, a plurality of device isolation regions 52 are formed in the control region of a semiconductor substrate 50. A passivation layer (not shown), such as a silicon nitride layer, is then formed to cover the control region. Then, a first oxidation process is carried out to partially grow a silicon dioxide layer 54*a* in the analog region. The passivation layer is then removed, and a second oxidation process is carried out to grow a remaining portion of the silicon dioxide layer 54 in the analog region and to grow a silicon dioxide layer 56*a* in the control region. Examples of the first and second oxidation processes include conventional thermal or plasma enhanced chemical vapor deposition processes.

Although the invention is not so limited, transistors located in the analog region of the CMOS image sensor may generally operate at a higher voltage (e.g., 2.8V) than transistors located in the control region (e.g., 1.8V). As such, the thicknesses of the gate dielectric layers in the analog region (e.g., 7 nm) may be greater than the thickness of the dielectric layers of the control region (e.g., 7 nm).

As described above, the analog region is exposed to two oxidation processes, whereas the control region is exposed to a single oxidation process. As such, the gate dielectric layer 54*a* of the analog region may be formed to a greater thickness than the gate dielectric layer 56*a* of the control region.

Other methods may be utilized to obtain gate dielectric layers of differing thicknesses. As one example only, after an initial silicon oxide layer is formed over an entirety of the substrate 50, the surface portion of the silicon oxide layer located over the control region may be removed to reduce its thickness. Thereafter, the entire surface of the substrate 50 may be oxidized.

Figure 6B:
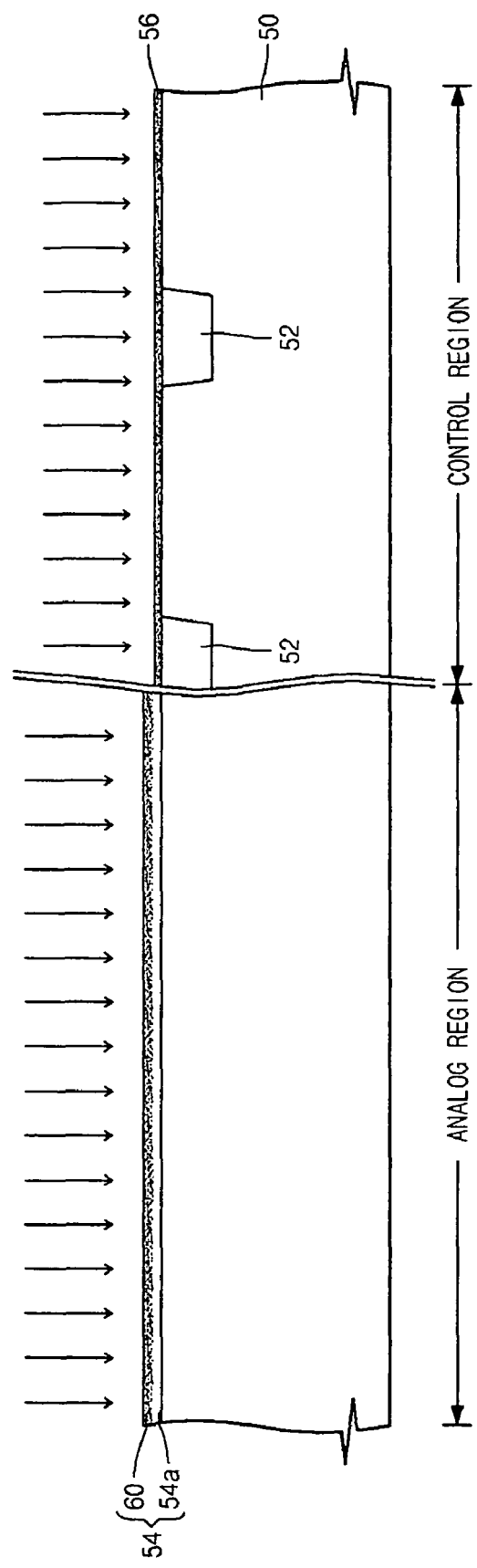

Referring now to FIG. 6B, the dielectric layers 54*a* and 56*a* (FIG. 6A) are subjected to plasma treatment in a nitrogen atmosphere to form a plasma nitrided oxide layer 54 in the analog region of the substrate 50, and to form a plasma nitrided oxide layer 56 in the control region of the substrate 50. The plasma treatment may, for example, be performed at room temperature, at a pressure of between 20 mTorr to 12 Torr, at a plasma power of between 20 Watts and 200 Watts, and with a nitrogen inflow rate of between 50 and 5000 sccm.

It is possible that the plasma treatment may not result in substantial penetration of nitrogen atoms through the entire depth of the nitrided layer 54. For this reason, FIG. 6B generally illustrates a two-layer oxide structure 60/54*a* over the analog region of the substrate 6B, where the lower portion 54*a* is substantially non-nitrided and the upper portion 60 is substantially plasma nitrided. It should be noted, however, that the invention is not so limited, and that there is no abrupt demarcation line within the oxide layer between the upper nitrided portion and the lower non-nitrided portion. Further, the lower portion 54*a* of the oxide layer 54 may contain some nitrogen atoms. However, the concentration of nitrogen in the lower portion should preferably be low enough to minimize the trap density at the interface with the substrate 50, thus reducing flicker in the later formed transistors of the analog sensing circuits.

As one alternative, a thermally nitrided oxide layer can be formed instead of the plasma nitrided oxide layer 56. In this case, the thermally nitrided oxide layer can be obtained, for example, at the temperature of between 800° C. and 1000° C. in a furnace environed with oxide source gas and nitrogen gas. Generally, this would be while the analog region is covered with a passivation layer and prior to nitrogen plasma treatment of the oxide layer formed over the analog region.

Figure 6C:
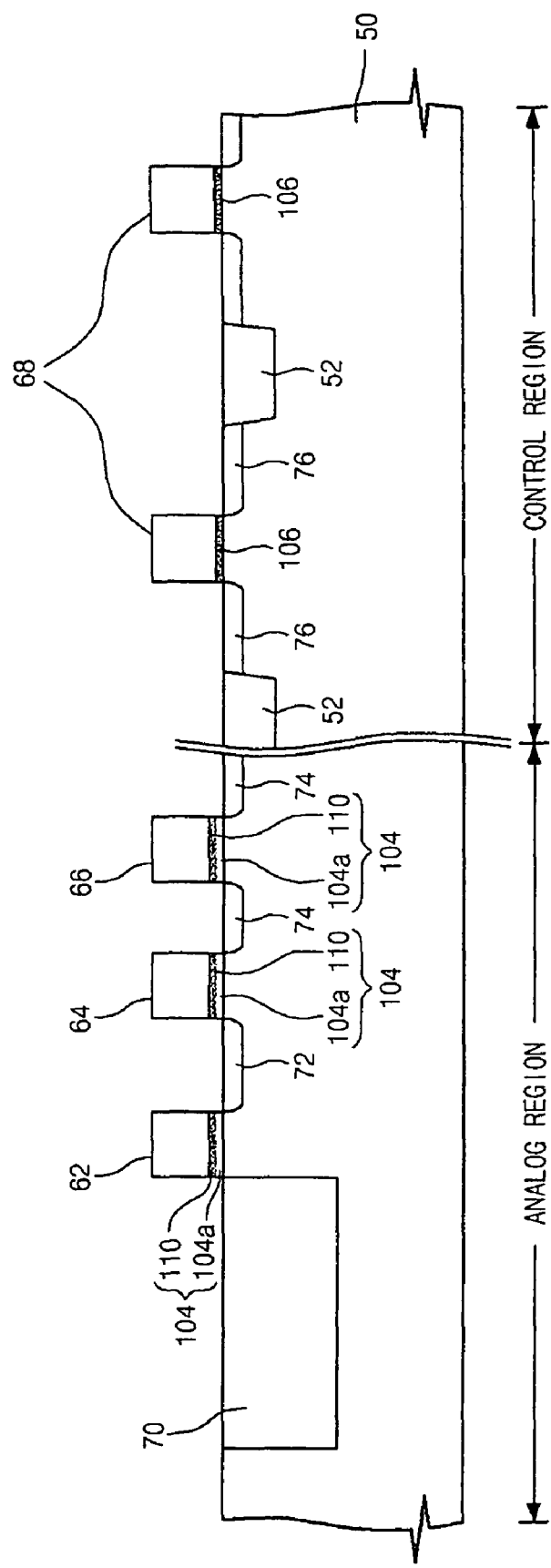

For completeness, FIG. 6C is a cross-sectional view illustrating the same structure as FIG. 5, which may be fabricated using conventional techniques from the structure of FIG. 6B. Generally, a polysilicon layer is patterned to form the gate electrodes 62, 64, 66 and 68, the oxide layers 54 and 56 (FIG. 6B) are etched to form the gate dielectric layers 104 and 106, and implantation processes are carried out to form the photodetector region 70 and the source/drain regions 72, 74 and 76.

Like reference numbers denote like elements in FIGS. 5 and 6C, and accordingly, a detailed functional description of each of the elements of FIG. 6C is omitted here.

The gate dielectric layers 104 of FIG. 6C are formed from the plasma nitride silicon oxide layer 54 of FIG. 6B. In other words, reference numbers 110 and 104a of FIG. 6C respectively correspond to the nitrided portion 60 and non-nitrided portion 54a of the oxide layer 54 of FIG. 6B. Also, the gate dielectric layers 106 of FIG. 6C are formed from the nitrided silicon oxide layer 56 of FIG. 6B. As such, the gate dielectric layers 104 of the analog region of the image sensor are formed of plasma nitrided silicon oxide and thus are effective in suppressing flicker noise, while the gate dielectric layers 106 of the control region of the image sensor are formed of nitrided silicon oxide and thus are effective in inhibiting boron penetration from the gate electrodes of p-type MOSFETs.

Figure 7:
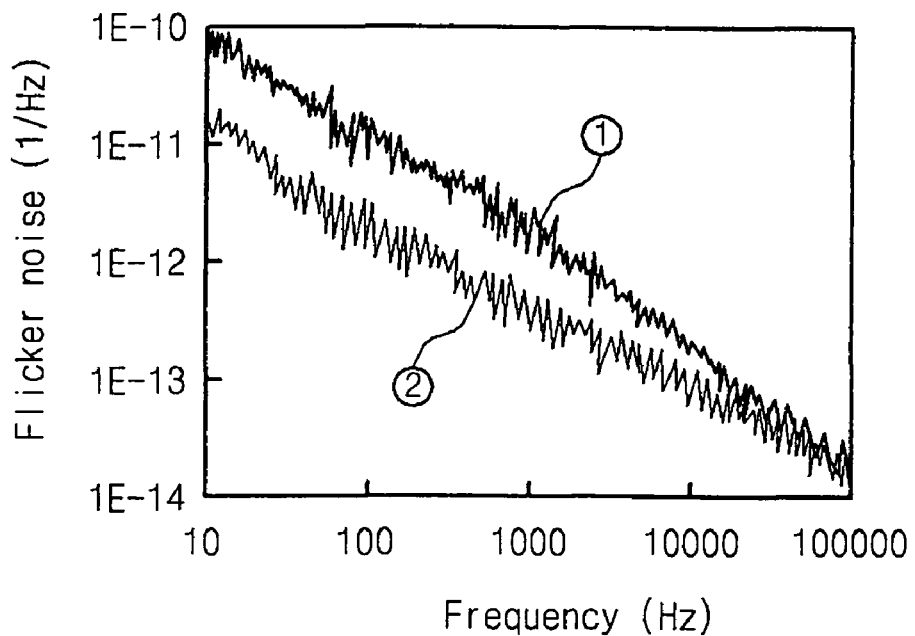
FIG. 7 is a graph illustrating flicker noise characteristics of a convention image sensor and an image sensor according to an embodiment of the present invention.

FIG. 7 is a graph illustrating flicker noise characteristics obtained from experimental results. In particular, the line identified by circle-1 represents flicker noise measured in a four-transistor active pixel having thermally nitrided gate dielectrics. The line identified by circle-2 represents flicker noise measured in a four-transistor active pixel having plasma nitrided gate dielectrics. As shown, flicker noise varied with frequency but was substantially improved in the case of plasma nitrided gate dielectrics.

Figure 8:
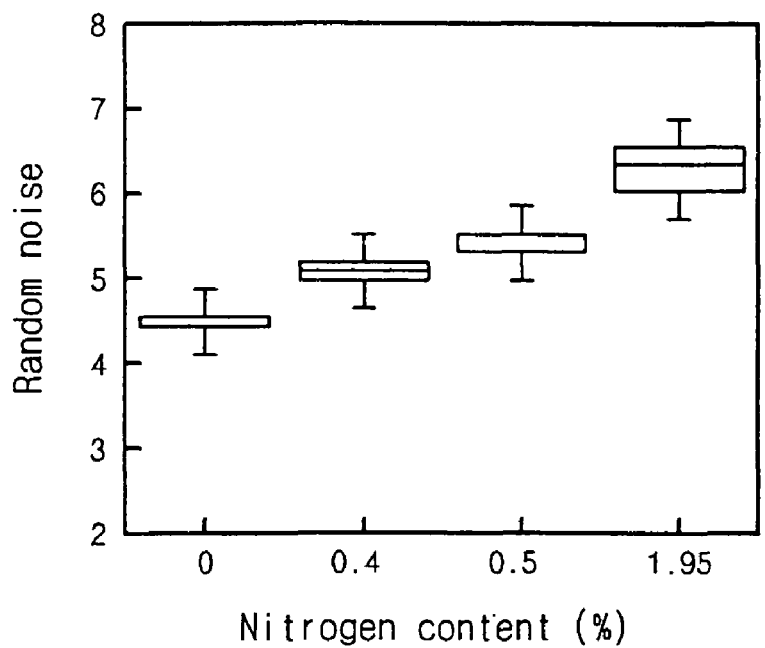
FIG. 8 is a graph illustrating a relationship between random noise and nitrogen content in an active pixel of an image sensor.

FIG. 8 is a graph illustrating the relationship between random noise and nitrogen concentration in the gate dielectrics of an active pixel. As shown, random noise increases with an increase in nitrogen concentration.

Figure 9:
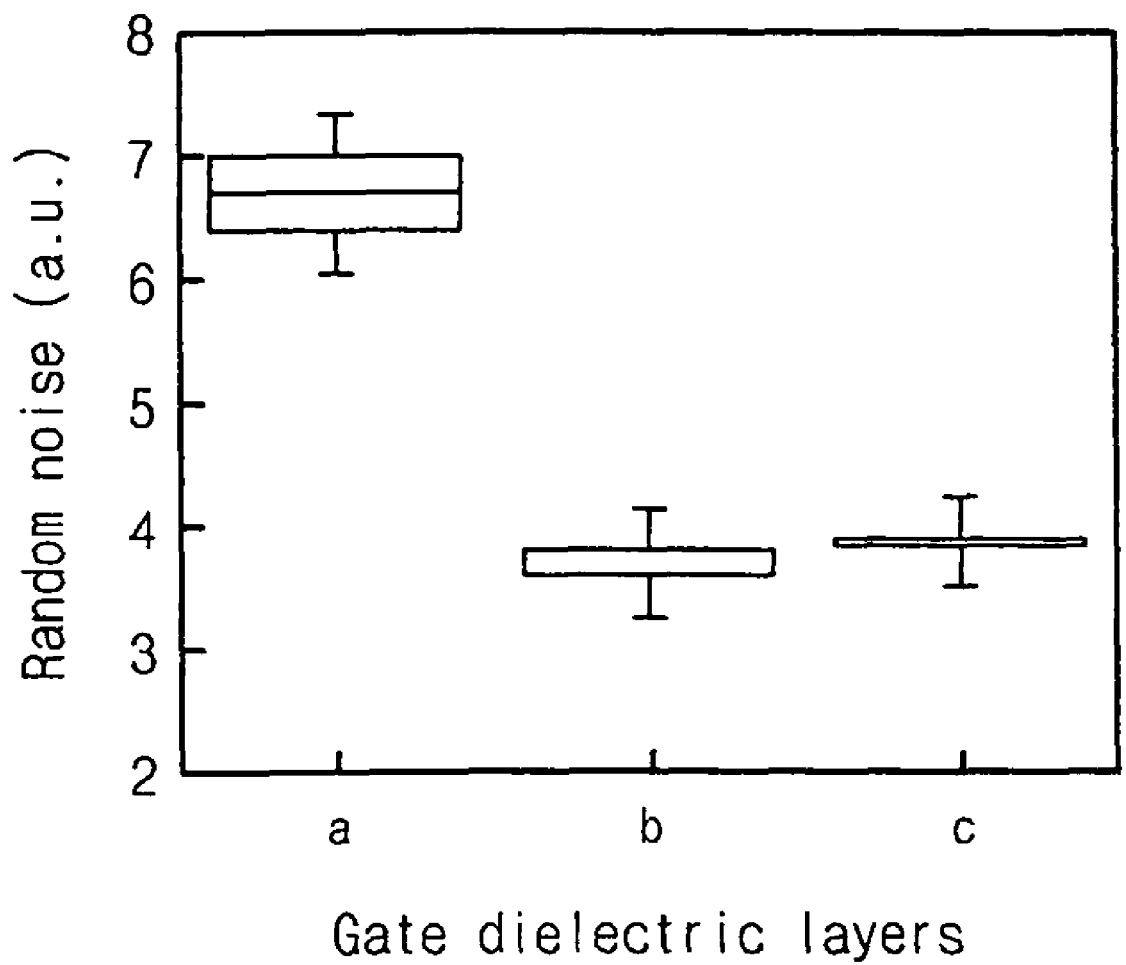
FIG. 9 is a graph illustrating a relationship between random noise and the type of gate dielectric material utilized in an active pixel of an image sensor.

FIG. 9 is a graph illustrating a comparison between the random noise exhibited by the conventional active pixel gate dielectric layers and the active pixel gate dielectric layers of embodiments of the present invention. In particular, "a" denotes a thermally nitrided oxide layer, "b" denotes a plasma nitrided oxide layer, and "c" denotes a pure siliconoxide layer. As shown, the plasma nitrided silicon oxide layer "b" exhibits a similar level of random noise as that of the pure silicon oxide layer "c", and the thermally nitrided silicon oxide layer "a" exhibits about 60 percent more random noise than that of both the plasma nitrided silicon oxide layer "b" and the pure silicon oxide layer "c".

Figure 10:
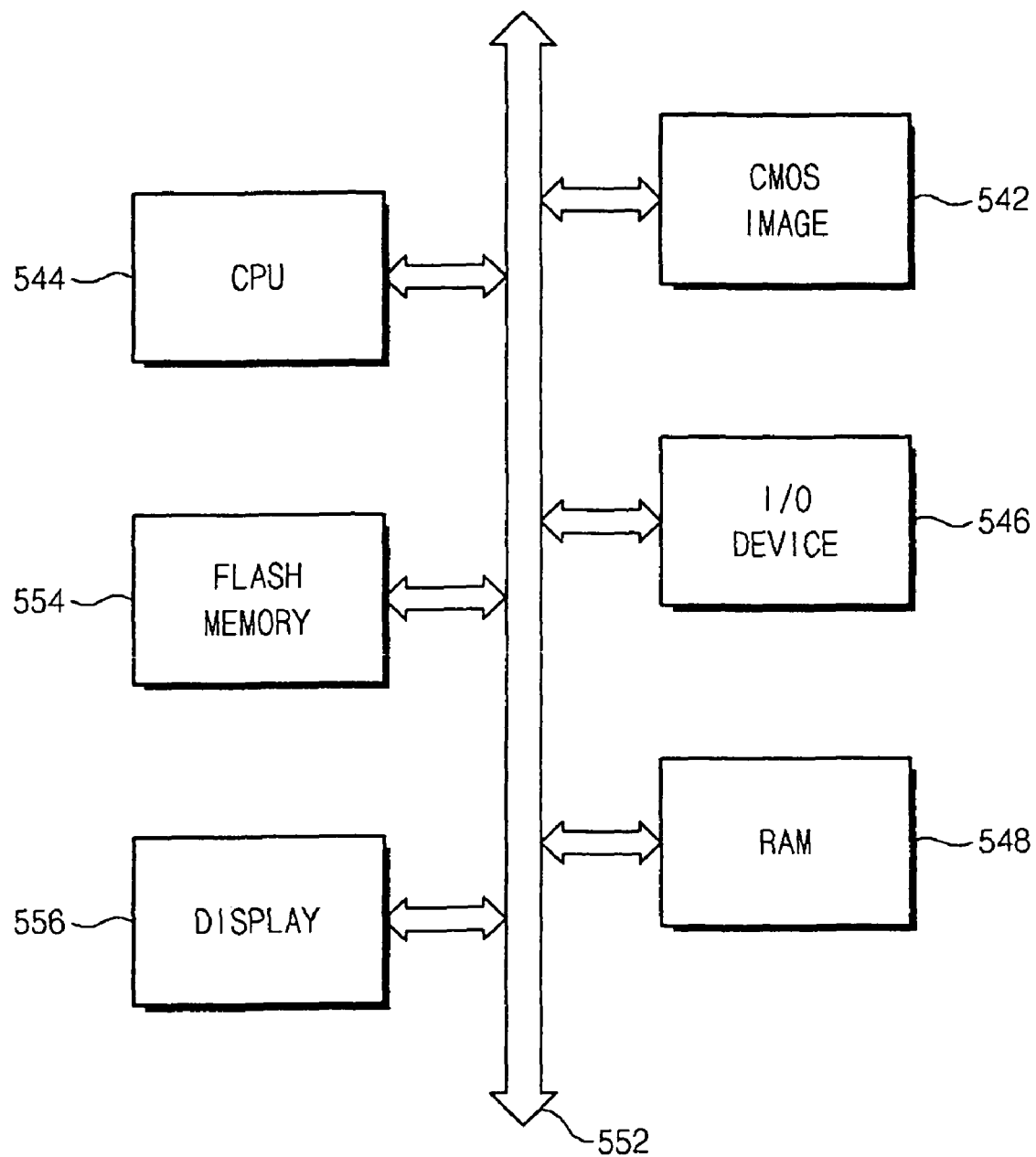
FIG. 10 is a block diagram of a processor based system employing an image sensor according to embodiments of the present invention.

FIG. 10 illustrates an exemplary processor-based system having a CMOS imager device 542, where the CMOS imager device 542 includes image sensor according to the above-described embodiments of the present invention. The processor-based system is exemplary of a system receiving the output of a CMOS imager device. Without being limiting, such a system could include a computer system, camera system, scanner, machine vision system, vehicle navigation system, video phone, surveillance system, auto focus system, star tracker system, motion detection system, image stabilization system, mobile phone, all of which can utilize the present invention.

Referring to FIG. 10, the processor based system of this example generally includes a central processing unit (CPU) 544, for example, a microprocessor, that communicates with an input/output (I/O) device 546 over a bus 552. The CMOS imager device 542 produces an output image from signals supplied from an active pixel array of an image sensor, and also communicates with the system over bus 552 or other communication link. The system may also include random access memory (RAM) 548, and, in the case of a computer system may include peripheral devices such as a flash-memory card slot 554 and a display 556 which also communicate with the CPU 544 over the bus 552. It may also be desirable to integrate the processor 544, CMOS imager device 542 and memory 548 on a single integrated circuit (IC) chip.

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. An image sensor comprising an active pixel array and a control circuit connected to the active pixel array on a substrate, the active pixel array comprising a plurality of first gate dielectric layers, and the control circuit comprising a plurality of second gate dielectric layers, wherein the first gate dielectric layers are nitrided silicon oxide layers comprising non-nitrided silicon oxide portions directly on the substrate and nitrided silicon oxide portions directly on and in contact with the non-nitrided silicon oxide portions.

2. The image sensor of claim 1, wherein the second gate dielectric layers are at least one of thermally nitrided silicon oxide layers and plasma nitrided silicon oxide layers.

3. The image sensor of claim 2, wherein a thickness of the first gate dielectric layers is greater than a thickness of the second gate dielectric layers.

4. The image sensor of claim 1, wherein the control circuit is comprised of digital CMOS circuits.

5. The image sensor of claim 1, wherein the control circuit is comprised of analog circuits.

6. The image sensor of claim 2, wherein the active pixel array comprises a matrix of active pixels, and wherein each of the active pixels comprises:
   the substrate of a first conductivity type;
   a photodiode region of a second conductivity type located in the substrate;
   a floating diffusion region located in the substrate and electrically connected to the photodiode region; and
   an amplifying transistor having a first gate electrode electrically connected to the floating diffusion region.

7. The image sensor of claim 6, wherein each of the active pixels further comprises a reset gate located between the floating diffusion region and a reference potential source.

8. The image sensor of claim 7, wherein each of the active pixels further comprises a transmission gate located between the photodiode region and The floating diffusion region.

9. The image sensor of claim 8, wherein each of the active pixels further comprises output line and a switching gate located between a source/drain region of the amplifying transistor and the output line.

10. An image sensor, comprising:
    an active pixel array comprising a matrix of active pixels, wherein each of the active pixels comprises:
    a substrate of a first conductivity type;
    a photodiode region of a second conductivity type located in the substrate; and an amplifying transistor having a first gate electrode electrically connected to the photodiode region and including a first gate dielectric located between the surface of the substrate and the first gate electrode, wherein the first gate dielectric is a nitrided silicon oxide layer comprising non-nitrided silicon oxide portions directly on the substrate and nitrided silicon oxide portions directly on and in contact with the non-nitrided silicon oxide portions.

11. The image sensor of claim 10, wherein the first gate electrode of the amplifying transistor is electrically connected to a floating diffusion region formed in the substrate, and wherein each of the active pixels further comprises:

a reset gate located between the floating diffusion region and a reference potential source;

a transmission gate located between the photodiode region and the floating diffusion region;

an output line; and a switching gate located between a source/drain region of the amplifying transistor and the output line.

12. The image sensor of claim 11, wherein a gate dielectric layer of each of the reset gate, the transmission gate and the switching gate is formed of a plasma nitrided silicon oxide.

13. An image sensor of claim 10, wherein the first conductivity type is p-type, and the second conductivity type is n-type.

14. An image sensor, comprising:

an active pixel array comprising a matrix of active pixels; and a control circuit connected to the active pixel array, wherein each of the active pixels comprises:

a substrate of a first conductivity type;

a photodiode region of a second conductivity type located in the substrate; and an amplifying transistor having a first gate electrode electrically connected to the photodiode region and including a first gate dielectric located between the surface of the substrate and the first gate electrode, wherein the first gate dielectric is a nitrided silicon oxide layer having a peak nitrogen concentration in an upper half of the layer relative to a bottom surface of the layer adjacent the substrate, and wherein the nitrided silicon oxide layer comprises a nitrided silicon oxide portion formed in the upper half of the layer, and a non-nitrided silicon oxide portion directly beneath and in contact with the nitrided silicon oxide portion and directly on the surface of the substrate; and wherein the control circuit comprises a pair of CMOS transistors each having a second gate electrode and a second gate dielectric located between the surface of the substrate and the second gate electrode.

15. The image sensor of claim 14, wherein the first gate electrode of the amplifying transistor is electrically connected to a floating diffusion region formed in the substrate, and wherein each of the active pixels further comprises:

a reset gate located between the floating diffusion region and a reference potential source;

a transmission gate located between the photodiode region and the floating diffusion region;

an output line; and a switching gate located between a source/drain region of the amplifying transistor and the output line.

16. The image sensor of claim 15, wherein a gate dielectric layer of each of the reset gate, the transmission gate and the switching gate is formed of a nitrided silicon oxide layer having a having a peak nitrogen concentration in an upper half of each layer relative to a bottom surface of each layer adjacent the substrate.

17. An image sensor of claim 14, wherein the first conductivity type is p-type, and the second conductivity type is n-type.

18. The image sensor of claim 14, wherein the second gate dielectric is at least one of thermally nitrided oxide layer and plasma nitrided oxide layer.

19. An image sensor, comprising an active pixel array on a substrate and a control circuit connected to the active pixel array on the substrate, the active pixel array comprising a plurality of first gate dielectric layers, and the control circuit comprising a plurality of second gate dielectric layers, wherein the first gate dielectric layers are pure silicon dioxide layers directly on the substrate and the second gate dielectric layers are at least one of thermally nitrided oxide layers and plasma nitrided oxide layers;

wherein the nitrided oxide layers comprise non-nitrided silicon oxide portions directly on the substrate and nitrided silicon oxide portions directly on and in contact with the non-nitrided silicon oxide portions.

20. The image sensor of claim 19, wherein a thickness of the first dielectric layers is greater than a thickness of the second gate dielectric layers.

21. The image sensor of claim 19, wherein the control circuit is comprised of digital CMOS circuits.

22. The image sensor of claim 19, wherein the control circuit is comprised of analog circuits.

23. The image sensor of claim 19, wherein the active pixel array comprises a matrix of active pixels, and wherein each of the active pixels comprises:

the substrate of a first conductivity type;

a photodiode region of a second conductivity type located in the substrate;

a floating diffusion region located in the substrate and electrically connected to the photodiode region; and an amplifying transistor having a first gate electrode electrically connected to the floating diffusion region.

24. The image sensor of claim 23, wherein each of the active pixels further comprises a reset gate located between the floating diffusion region and a reference potential source.

25. The image sensor of claim 24, wherein each of the active pixels further comprises a transmission gate located between the photodiode region and the floating diffusion region.

26. The image sensor of claim 25, wherein each of the active pixels further comprises output line and a switching gate located between a source/drain region of the amplifying transistor and the output line.

* * * * *